United States Patent [19]

Aono et al.

[11] 4,039,868
[45] Aug. 2, 1977

[54] CIRCUIT FOR GENERATING PULSES WITH DURATION PROPORTIONAL TO QUOTIENT OF TWO INPUT VOLTAGES

[75] Inventors: Shigeo Aono, Tokyo; Hiromichi Nakamura; Hiroshige Ozawa, both of Yokohama, all of Japan

[73] Assignee: Nissan Motor Co., Ltd., Yokohama, Japan

[21] Appl. No.: 590,084

[22] Filed: June 25, 1975

[30] Foreign Application Priority Data

June 26, 1974 Japan .................. 49-73107

[51] Int. Cl.² .................. H03K 5/04; H03K 3/10; G06G 7/16
[52] U.S. Cl. .................. 307/273; 307/265; 328/161
[58] Field of Search .................. 307/273, 265; 328/161

[56] References Cited
U.S. PATENT DOCUMENTS

| | | | |
|---|---|---|---|
| 3,346,746 | 10/1967 | Gordon | 307/273 |
| 3,453,453 | 7/1969 | Hughes | 307/273 |
| 3,569,743 | 3/1971 | Baessler | 307/273 |
| 3,651,345 | 3/1972 | Lundgreen | 307/273 |
| 3,705,991 | 12/1972 | Hobo | 307/273 |
| 3,801,834 | 4/1974 | Lai | 307/273 |
| 3,829,716 | 8/1974 | Goyer | 307/273 |

*Primary Examiner*—Stanley D. Miller, Jr.

[57] ABSTRACT

First and second transistors are connected in a monostable multivibrator configuration. A capacitor is coupled between the collector of the first transistor and the base of the second transistor. A first control voltage is applied to the collector of the first transistor to charge the capacitor when the second transistor is conductive. A constant current source is provided to charge the capacitor at a constant rate determined by a second control voltage. The stored energy is discharged through the first transistor when energized in a successive cycle. The capacitor is recharged by the constant current source through the first transistor to linearly raise the potential at the base of second transistor. The transistors are triggered by the distributer of an engine so that a control pulse is generated for each revolution of the engine's output shaft. The width of the output pulse from the collector of second transistor is proportional to the first input voltage and inversely proportional to the second input voltage. When the pulse generators are cascaded in a suitable manner, the width of the output pulse is proportional to the product of the two input voltages.

2 Claims, 7 Drawing Figures

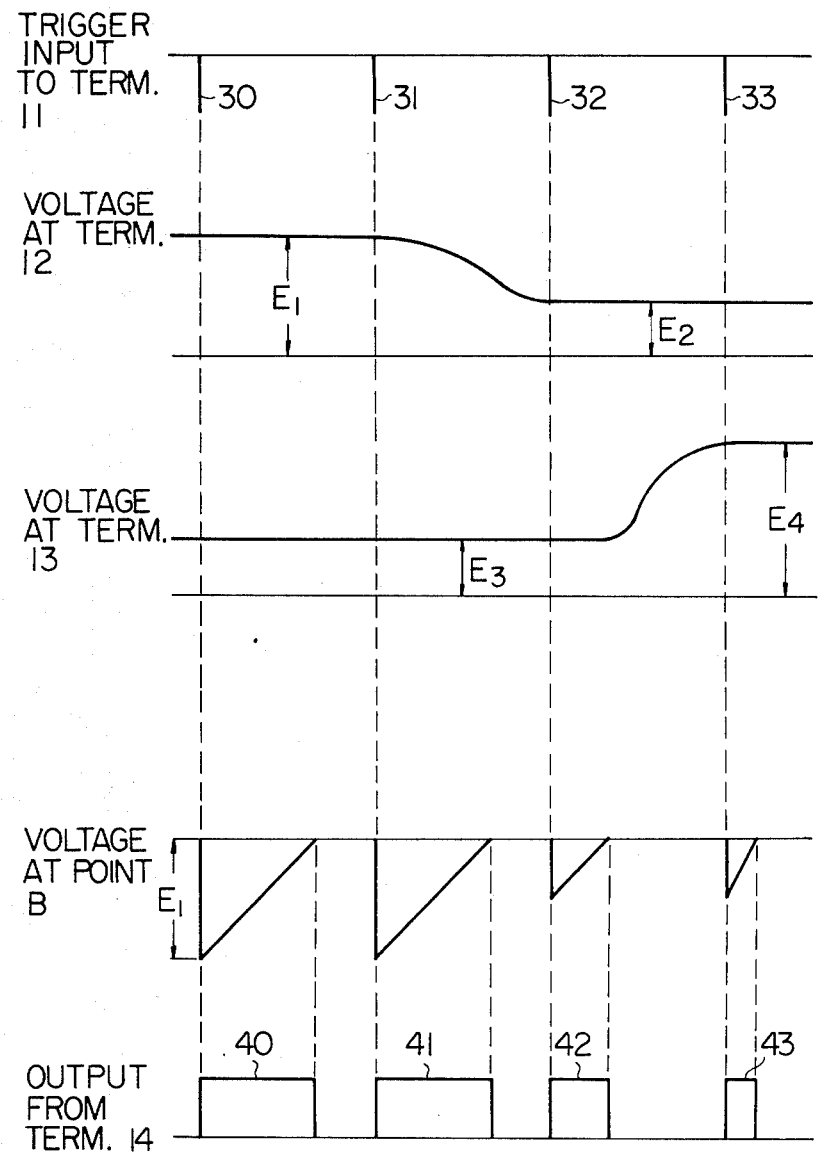

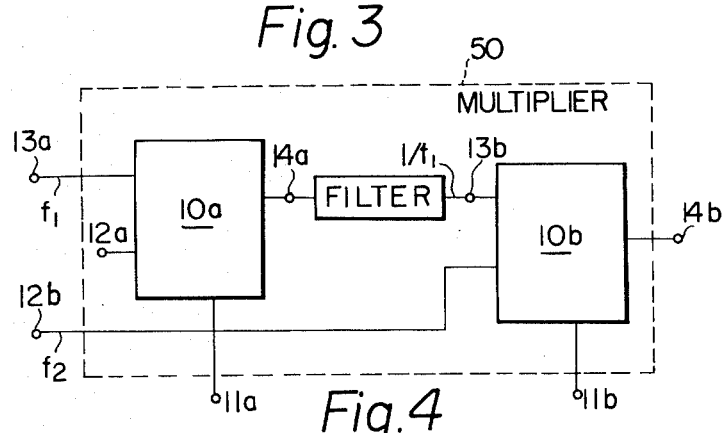
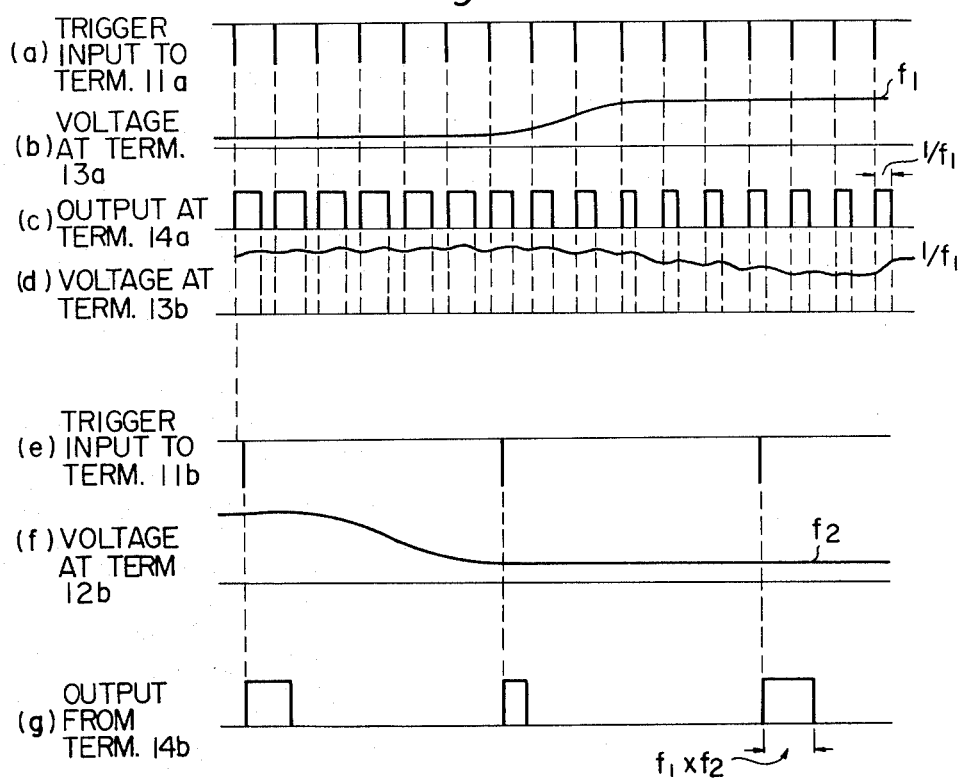

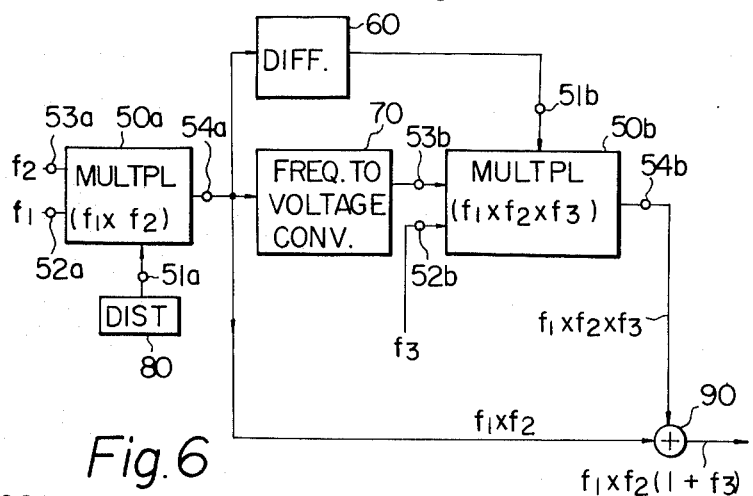
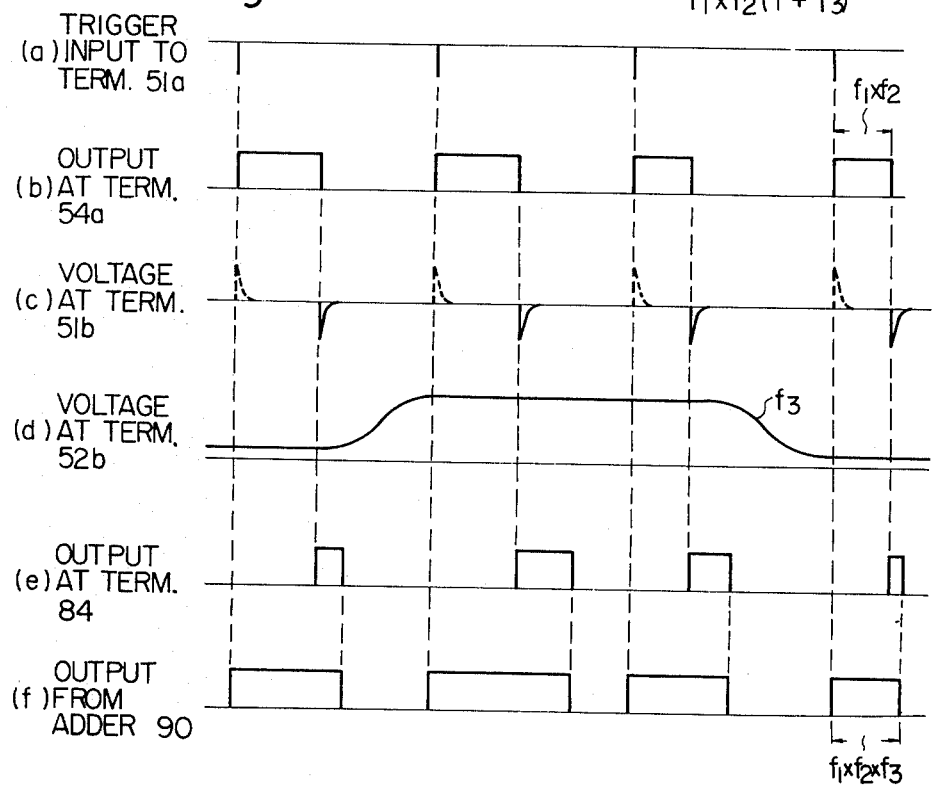

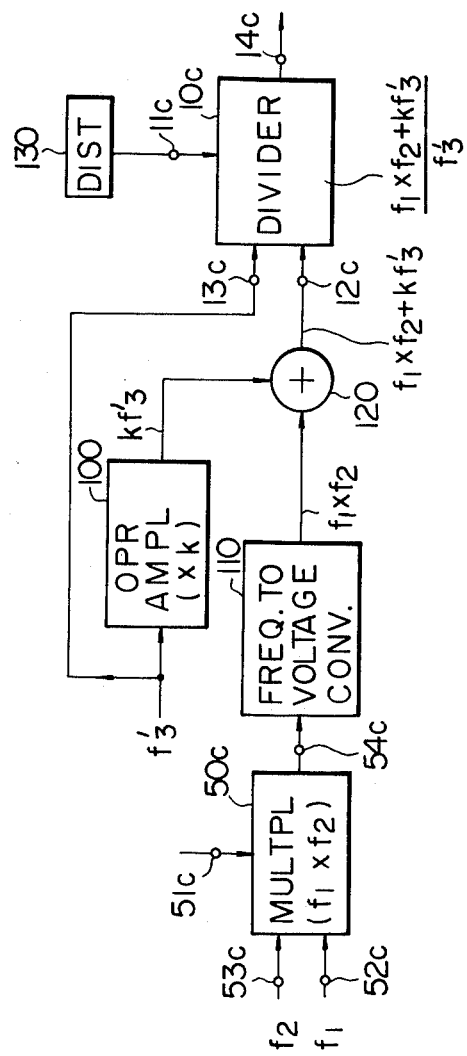

CIRCUIT FOR GENERATING PULSES WITH DURATION PROPORTIONAL TO QUOTIENT OF TWO INPUT VOLTAGES

The present invention relates generally to electronic fuel injection, and more particularly to pulse generators to be utilized for operating the fuel injection valve.

Electronic fuel injection of internal combustion engines is an accurate means of preparing the proper air-to-fuel mixture for the individual cylinders under all operating conditions. Electronic fuel injection not only improves the engine performance and maximizes fuel economy, but also can curtail objectionable emissions generated by the engine. Fuel delivery is regulated by a number of sensors located strategically around the engine. These sensors convert physically measurable quantities, such as engine speed and manifold absolute pressure into proportional electrical signals which are processed by an operational circuit which determines the amount of fuel necessary to ensure the highest torque, best fuel economy and lowest exhaust emissions. The delivery of fuel to the engine is controlled by the width of the command pulse generated by the operational circuit. However, the prior circuit required to perform the function of generating the command pulse is complex because of the difficulty in precisely relating the pulse width to the engine operating conditions with simple circuitry.

Therefore, the primary object of the present invention is to provide a novel pusle generator for electronic fuel injection which receives two input variables and generates command pulses such that the width of the pulses varies as a function of the quotient of the input variables in a simplified circuit configuration.

Another object of the invention is to provide a pulse generator which functions to vary the width of the output pulses as a function of the product of two input variables.

A further object of the invention is provide a pulse generator which operates in a fast response time.

A characterizing feature of the invention is that the width of the output pulses from a basic configuration of the pulse generator varies as a function of the quotient of two input variables and the conbination of such basic configuration permits it to vary as a function of the product of two input variables. The basic circuit of the invention is therefore permits a variety of combinations. This allows a design in which the control unit can be tailored to any specific requirements of an engine.

Briefly described, the present invention contemplates the use of a monostable multivibrator including a first and a second transistor, a capacitor coupled across the collector of the first transistor and the base of the second transistor and a constant current source responsive to a control voltage. When the second transistor is conductive, the capacitor is charged to a first input control voltage applied to the collector of the first transistor and instantly discharged upon conduction of the second transistor by application of a trigger pulse which may be in synchronism with the engine revolution. Upon discharge of the capacitor, the potential at the base of second transistor is instantly dropped to a negative level which linearly rises to the original level as the capacitor is recharged at a constant rate determined by a second input control voltage. The width of an output pulse from the second transistor is proportional to the first control voltage while it is inversely proportional to the second control voltage. Therefore, the pulse generator so constructed performs arithmetic division of two input variables and if the first control voltage is held constant the pulse width varies as a function of the reciprocal of the second input voltage, while if the second control voltage is held constant, the pulse width varies as a function of the first control voltage.

Multiplication of the two input variables can be achieved by connecting the basic circuits of the pulse generator in cascaded form with a filter or a frequency to voltage converter inserted therebetween.

These and other advantages and features of the invention will become apparent from the following description taken in conjunction with the accompanying drawings, in which:

FIG. 2 is a diagram showing various waveforms of the signals appearing in the circuit of FIG. 1;

FIG. 3 is a pulse generator employing the circuit of FIG. 1 to serve as a further basic circuit of the invention;

FIG. 4 is a diagram showing the waveforms in the circuit of FIG. 3;

FIG. 5 is a first application of the circuits of FIGS. 1 and 3;

FIG. 6 is a diagram showing the waveforms in the circuit of FIG. 5; and

FIG. 7 is a second application of the circuits of FIGS. 1 and 3.

Figure 1:
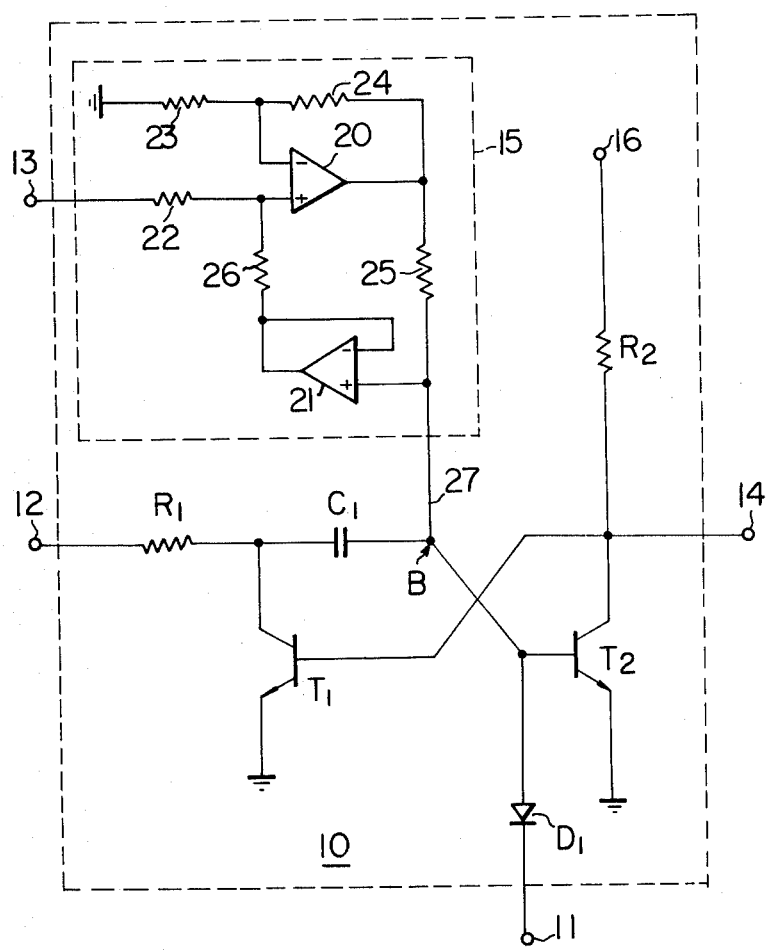
FIG. 1 is the basic circuit of the pulse generator of the invention.

Referring now to FIG. 1 there is shown a circuit diagram of a pulse generator embodying the invention. The generator is designed to produce output pulses, the width of the pulse being proportional to the voltage applied to a first input terminal thereto with a second input terminal being held at a constant voltage, and being inversely proportional to the voltage at the second input with the first input terminal being held at a constant voltage. The pulse generator of the invention can be utilized in various ways as will be fully described later and is particularly advantageous for use in controlling the fuel injection of an automotive vehicle. The pulse generator 10 is provided with a trigger terminal 11, first and second control input terminals 12 and 13 and an output terminal 14. The first control input terminal 12 is coupled through a resistor $R_1$ to the collector of a transistor $T_1$ and further through capacitor $C_1$ to the base of a transistor $T_2$. The base of transistor $T_1$ is connected to the collector of transistor $T_2$ and the emitter of the two transistors connected to ground so that they are constructed in a monostable multivibrator configuration. The trigger input terminal 11 is coupled through a diode $D_1$ to the base of transistor $T_2$. A constant current source 15, which is under the control of the voltage at the input terminal 13, is coupled to a point intermediate the capacitor $C_1$ and the base of transistor $T_2$. The constant current source 15 supplies a current which is at a constant value for a given voltage applied to the terminal 13 regardless of the magnitude of load connected to the output thereof. The circuit 15 comprises a first differential amplifier 20 and a second differential amplifier 21. The first differential amplifier 20 has its first or positive input terminal to the input terminal 13 by way of resistor 22 and a second or negative terminal coupled across a resistor 23. The output of amplifier 20 is coupled by a resistor 24 to the negative terminal thereof to feedback the signal output. Amplifier 21 has its first or positive terminal coupled by way of resistor 25 to the output of amplifier 20 and its second or negative terminal coupled directly to the output thereof which is also connected by way of resistor 26 to the positive terminal of amplifier 20. The signal output from the constant current source 15 appears at the positive input terminal of amplifier 21 and is coupled on lead 27 to the base of transistor $T_2$.

The amplifier 20 is adapted to compare the input voltages and deliver an output voltage proportional to the difference in voltage between the two inputs. The amplifier output is fed back to the negative input terminal. In the presence of the fed back signal, voltages at the output and the negative input are stabilized to a new set of values. The presence of output signal from amplifier 20 causes amplifier 21 to generate its output voltage which will be fed back to its negative input. Similarly, the amplifier 21 will produce an output at which the amplifier is stabilized. The signal output from amplifier 21 is coupled to the positive input terminal of amplifier 20 so that the output voltage of amplifier 20 is further affected. It will be appreciated that another feedback loop is formed through amplifier 20, resistor 25, amplifier 21 and resistor 26 to the positive input to amplifier 20. The output voltages of the two amplifiers will be further stabilized to a new set of values which are only determined by the input voltage at terminal 13. Under the stabilized condition, the input potentials at the terminals of both amplifiers are at the same level. If the voltage at the control terminal 13 is varied by a given amount, the feedback operation will commence and the output voltage on lead 27 will assume a new value which is proportional to the control voltage at terminal 13. When the load increases, the voltage at the output of amplifier 20 will increase correspondingly. The voltage increment is feedback to its input terminals through the aforesaid two feedback loops so that the voltage at the output of circuit 15 increases to compensate for the increase in load, so that the current drained from the source 15 to its load circuit is held at a constant value.

Under normal conditions (no signal on trigger input terminal), transistor $T_2$ of the pulse generator 10 remains conductive by the presence of a potential at the base electrode due to the output from the constant current source 15. Capacitor $C_1$ will be charged through resistor $R_1$ and develops a voltage substantially equal to voltage $E_1$ applied to the terminal 12, and the voltage at the output terminal 14 and the base of transistor $T_1$ is thus substantially at a ground reference level.

Actual operation of the circuit of FIG. 1 will be described in conjunction with FIG. 2. When a negative trigger pulse 30 is applied to the trigger terminal 11 of circuit 10, transistor $T_2$ will be turned off, causing its collector potential to rise to the voltage supplied from a power supply terminal 16 through a current-limiting resistor $R_2$. This in turn causes transistor $T_1$ to switch to the conduction state and allows the energy stored in capacitor $C_1$ to be discharged instantly. The potential at point B intermediate capacitor $C_1$ and the base of transistor $T_2$ will be dropped to a negative level $E_1$. Transistor $T_2$ will remain nonconductive until capacitor $C_1$ is recharged by the current supplied at a constant rate from the constant current source 15 to the ground reference level. The output terminal 14 remains at the high level until transistor $T_2$ becomes conductive again by the potential applied to the base thereof so that an output pulse 40 is produced. At the next trigger pulse 31, an output pulse 41 having the same pulse width as that of pulse 40 will be produced as long as the potential at terminal 12 remains constant.

When the voltage at terminal 12 is lowered to $E_2$ upon the occurrence of a subsequent pulse 32, the voltage developed across the capacitor $C_1$ is accordingly lowered and the width of the output pulse 42 will become narrow since it is related to the capacitor's discharge time. In the foregoing, the voltage at terminal 13 has been assumed at a constant voltage $E_3$, for example. If the voltage at terminal 13 is increased to $E_4$ at the subsequent trigger pulse 33, the voltage at the output of the constant current source 15 will rise and charge the capacitor $C_1$ at a higher constant rate than it is charged previously, so that an output pulse 43 of a shorter pulse width is produced.

It will therefore be understood that the width of the output pulse from the pulse generator 10 is proportional to the voltage at the input terminal 12 and inversely proportional to the voltage at the input terminal 13. Therefore, the width of the output pulse represents the product of a variable given to the first terminal 12 and the reciprocal of a variable given to the second terminal 13. The width of the output pulse can be the product of the two input variables if the second terminal 13 is supplied with the reciprocal of a variable.

In the following description, similar and circuits will be indicated at like numbers plus alphbet to identify the respective circuits.

A first example of the application of the aforesaid pulse generators is shown in FIG. 3 with reference to the waveforms shown in FIG. 4. A pulse generator 50 is comprised of the aforesaid pulse generators shown respectively within rectangles 10a and 10b. Pulse generator 10a has its output terminal 14a coupled to a filter or a frequency-to-voltage converter 51, the output of which being coupled to the second control input terminal 13b of pulse generator 10b. The first control input terminal 12a of pulse generator 10a is coupled to a constant voltage source (not shown) to maintain its potential constant at a suitable value. With this arrangement, the second input control terminal 13a of curcuit 10a is supplied with a control voltage $f_1$ which varies as a function of time as shown in FIG. 4b and the trigger input terminal 11a with trigger pulses or clocks (FIG. 4a). The signal at the output terminal 14a is the waveform shown in FIG. 4c in which the width of the pulse waveform is proportional to the reciprocal of the input to terminal 13a, that is $1/f_1$. The filter 51 produces a voltage signal which is related to the width of the input pulses so that the output voltage varies inversely proportional to $f_1$ as shown in FIG. 4d. The voltage signal from filter 51 is received at terminal 13b of pulse generator 10b. The first input terminal 12b of circuit 10b is supplied with a control voltage $f_2$ which varies as a function of time as shown in FIG. 4f and the trigger input 11b with trigger pulses shown in FIG. 4e. It is seen that the pulse generator 10b produces a pulse train at terminal 14b, the width of the pulse being proportional to $f_1$ times $f_2$. It is to be noted that the trigger input terminals 11a and 11b can be connected so that the two pulse generators are supplied with trigger pulses from the same source. Therefore, the pulse generator 50 may be called a multiplier-type pulse generator or simply multiplier in this specification. The multiplier 50 can be utilized as a basic circuit component to generate a signal controlling the fuel injection of an automobile.

In order to provide maximum fuel economy, highest torque and lowest exhaust emissions, fuel delivery must be precisely related to various engine operating conditions, and hence, the width of the pulses used to control the deliver of fuel to each cylinder of the engine.

One example of the relation between the engine conditions and the fuel quantity is represented by the following equation:

$$\text{Fuel quantity} = f_1(N) \cdot f_2(V) \{ 1 + f_3(T) \} \quad (1)$$

where, $f_1(N)$ is a function relating the number of revolution of the engine to the amount of fuel necessary to ensure highest torque, $f_2(V)$ being a function relating the manifold absolute pressure to the amount of fuel, and $f_3(T)$ relating the engine temperature to the amount of fuel.

Equation 1 can be realized in a circuit shown in FIG. 5. The multiplier-type pulse generator 50a receives input voltages $f_1(N)$ and $f_2(V)$ at its first and second inputs 52a and 53a, respectively. The trigger input 51a receives pulses generated by a distributer 80 of the engine (not shown) so that pulse generator 50a is triggered in synchronism with the revolution of the engine. The width of the output pulses on terminal 54a is the product of the two input voltages as shown in FIG. 6b. The trailing edge of the pulses from generator 50a is differentiated by a differentiator 60 as shown in FIG. 6c and concurrently converted in an analog signal by a frequency to voltage converter 70 as referred to above. The output from the converter 70 is coupled to the second input terminal 53b of the pulse generator 50b of the same type as generator 50a. A control voltage representative of $f_3(T)$ is coupled to the first input terminal 52b (FIG. 6d). The output from the differentiator 60 is applied to the trigger input 51b of generator 50b so that it is triggered for each engine revolution but delayed by the width of pulses of FIG. 6b. Pulse generaor 50b thus generates output pulses, the width of which being the product of $f_1(N)$, $f_2(V)$ and $f_3(T)$ as shown in FIG. 6e. An adder 90 is provided to receive outputs from the pulse generators 50a and 50b to sum up the trains of pulses to produce an output as shown in FIG. 6f, the width of the pulse output thus represents equation (1).

Another exemplary relation is represented by the following equation:

$$\text{Fuel quantity} = \frac{f_1(N) \times f_2(V) + k f_3'(T)}{f_3'(T)} \quad (2)$$

where, $f_3'(T)$ is the reciprocal of $f_3(T)$, and $k$ is a constant.

Equation 2 can be embodied in a circuit shown in FIG. 7 in which pulse generator 50c receives control voltages $f_1(N)$ and $f_2(V)$ at the respective input terminals 52c and 53c and produces an output pulse on terminal 54c in synchronism with trigger pulses on terminal 51c. The trigger pulses on terminal 51c may not necessarily be synchronized with the revolution of the engine because the output signal is converted into an analog form by frequency to voltage converter 110. Control voltage $f_3'(T)$ is received by an operational amplifier 100 which multiplies the amplitude of the input by a factor of $k$ and couples its output to an adder 120 to which the output from the converter 110 is also applied. The adder output is coupled to the first input terminal 12c of the pulse generator 10c of FIG. 1 and the control voltage $f_3'(T)$ is fed into the second input terminal 13c. The pulse generator 10c is driven by pulses derived from the distributer 130. The width of each of the resultant output pulses represents the quotient of the first input voltage on terminal 12c divided by the second input voltage on terminal 13c.

What is claimed is:

1. A circuit for generating pulses having a duration proportional to the quotient of two input voltages, the circuit comprising:

a source of supply voltage;

a monostable multivibrator circuit configuration having cross-coupled first and second transistors, the base of each respective one of said transistors being coupled to the collector of the other respective one of said transistors, a timing capacitor connected between the collector of said first transistor and the base of said second transistor and a trigger input connected to said base of said second transistor, and said collector of said second transistor being coupled to said source of supply voltage via a first resistor;

a constant current source including first and second differential amplifiers, each having its one input connected to the output thereof and the output of the first differential amplifier being connected to the other input of the second amplifier, the other input of the first amplifier being connected to the output of said second amplifier, and the other input of the second amplifier being connected to a junction between said capacitor and said base of said second transistor of the monostable multivibrator configuration to saturate said second transistor in the absence of a trigger signal applied to said trigger input;

a first input terminal biased at a first control voltage to serve as a dividend and connected via a second resistor to a junction between said capacitor and said collector of said first transistor for charging said capacitor whenever said second transistor is in its saturated state; and a second input terminal biased at a second control voltage to serve as a divisor for the dividend and connected to the other input of said first differential amplifier of said constant current source to control rate of variation of current discharged from said capacitor in proportion to the second voltage whenever said first transistor is in its saturated state subsequent to occurrence of a trigger signal;

whereby the pulses produced at the collector of the second transistor have a duration proportional to the quotient of the control voltages.

2. A circuit as claimed in claim 1, wherein the signal applied to the first input terminal is maintained at a constant voltage level.

* * * * *